(12) United States Patent
Morishige et al.

(10) Patent No.: US 7,713,845 B2
(45) Date of Patent: May 11, 2010

(54) LASER PROCESSING METHOD FOR WAFER

(75) Inventors: Yukio Morishige, Ota-ku (JP); Kenji Asano, Ota-ku (JP); Yohei Yamashita, Ota-ku (JP)

(73) Assignee: Disco Corporation, Tokyo (JP)

( * ) Notice: Subject to any disclaimer, the term of this patent is extended or adjusted under 35 U.S.C. 154(b) by 407 days.

(21) Appl. No.: 11/901,774

(22) Filed: Sep. 19, 2007

(65) Prior Publication Data
US 2008/0076233 A1 Mar. 27, 2008

(30) Foreign Application Priority Data
Sep. 25, 2006 (JP) ............................. 2006-259322

(51) Int. Cl.
*H01L 21/00* (2006.01)

(52) U.S. Cl. ............................. 438/462; 257/E21.599

(58) Field of Classification Search ................ 438/460, 438/462, 463, 465, 112, 113, 114
See application file for complete search history.

(56) References Cited

U.S. PATENT DOCUMENTS 6,974,726 B2 * 12/2005 Dani et al. .................. 438/114

2004/0112880 A1 * 6/2004 Sekiya ..................... 219/121.69
2004/0211762 A1 * 10/2004 Sekiya et al. ............ 219/121.82
2008/0070380 A1 * 3/2008 Kusunoki ..................... 438/462

FOREIGN PATENT DOCUMENTS

| JP | 10-305420 | 11/1998 |
| JP | 2004-188475 | 7/2004 |
| JP | 2004-322168 | 11/2004 |

\* cited by examiner

*Primary Examiner*—W. David Coleman
*Assistant Examiner*—Shaka Scarlett
(74) *Attorney, Agent, or Firm*—Greer, Burns & Crain, Ltd.

(57) ABSTRACT

A laser processing method for a wafer such that a laser beam is applied to a work surface of the wafer along a separation line formed on the work surface to thereby form a laser processed groove along the separation line on the work surface by ablation. The laser processing method includes a protective material coating step for coating the work surface of the wafer with a liquid protective material mainly containing a water-soluble silicone oil and a laser processed groove forming step for applying the laser beam to the work surface coated with the protective material along the separation line in the condition that the protective material has fluidity, thereby forming the laser processed groove along the separation line.

5 Claims, 8 Drawing Sheets

LASER PROCESSING METHOD FOR WAFER

BACKGROUND OF THE INVENTION

1. Field of the Invention

The present invention relates to a laser processing method for a wafer such that a laser beam is applied to a work surface of the wafer along a separation line formed on the work surface to thereby form a laser processed groove along the separation line on the work surface.

2. Description of the Related Art

As well known in the art, a semiconductor wafer having a plurality of semiconductor chips such as ICs (Integrated Circuit) and LSIs (Large Scale Integration) arranged in a matrix on the upper surface of a semiconductor substrate such as a silicon substrate is fabricated in a semiconductor device fabrication process. In such a semiconductor wafer, the semiconductor chips are separated from each other by a plurality of separation lines called streets preliminarily formed on the semiconductor substrate, and the semiconductor wafer is cut along these streets to obtain the individual semiconductor chips. Further, in an optical device wafer, the upper surface of a sapphire substrate or the like is partitioned into a plurality of regions by a plurality of streets formed in a matrix, and a gallium nitride compound semiconductor or the like is stacked in each of these partitioned regions of the substrate to thereby form an optical device. Such an optical device wafer is cut along the streets into a plurality of optical devices such as light emitting diodes and laser diodes, which are widely used for electrical equipment.

Cutting of a wafer such as a semiconductor wafer and an optical device wafer along the streets is usually performed by using a cutting device called a dicer. This cutting device includes a chuck table for holding a wafer as a work, cutting means for cutting the wafer held on the chuck table, and moving means for relatively moving the chuck table and the cutting means. The cutting means includes a rotary spindle adapted to be rotated at high speeds and a cutting blade mounted to the rotary spindle. In cutting the wafer by using such a cutting device, there is a limit to a feed speed and the devices on the wafer may be contaminated by chips generated in cutting.

As a method for separating a plate-like work such as a semiconductor wafer into a plurality of semiconductor chips or the like, there has recently been proposed a method including the steps of applying a pulsed laser beam to the work along a plurality of separation lines formed on the work to thereby form a plurality of laser processed grooves by ablation and next breaking the work along these laser processed grooves by using a mechanical breaking device (see Japanese Patent Laid-open No. 10-305420, for example).

Such laser processing has advantages over cutting such that a processing speed is higher and a wafer formed of a hard material such as sapphire can be processed relatively easily. However, in performing the ablation by the application of a laser beam to the wafer along the separation lines, thermal energy is concentrated at a region irradiated with the laser beam, causing the generation of debris, and this debris may stick to the surfaces of the chips formed on the wafer, causing a degradation in quality of the chips.

To solve this problem due to the debris, there has recently been proposed a laser processing method including the steps of coating the work surface of a wafer with a protective film formed of liquid resin such as polyvinyl alcohol and next applying a laser beam through the protective film to the work surface of the wafer (see Japanese Patent Laid-open No. 2004-188475, for example). Further, there has been proposed a laser processing device including protective film forming means for forming a protective film of liquid resin such as polyvinyl alcohol on the work surface of a wafer, so as to efficiently perform laser processing (see Japanese Patent Laid-open No. 2004-322168, for example).

The protective film of liquid resin such as polyvinyl alcohol as formed on the work surface of the wafer is solidified at ordinary temperatures. Accordingly, the laser beam is applied through the solid protective film to the work surface of the wafer to form the laser processed grooves by ablation, so that the protective film is separated from the work surface of the wafer, causing the deposition of debris on the work surface of the wafer on both sides of each laser processed groove. Further, in the case that the debris that has scattered falls onto the protective film and that the debris is relatively large, the solid protective film is melted by the heat of the debris, so that the debris comes into direct deposition onto the surface of any device formed on the wafer, causing a degradation in quality of the device.

Further, the protective film is absent in a region where the laser processed grooves have been formed along the separation lines extending in a first direction. Accordingly, in forming the laser processed grooves along the separation lines extending in a second direction intersecting the first direction, the debris that has scattered comes into deposition to the wall surface of each laser processed groove already formed. The deposition of the debris to the wall surface of each laser processed groove causes a problem that the wafer cannot be reliably broken along each laser processed groove in the next breaking step.

SUMMARY OF THE INVENTION

It is therefore an object of the present invention to provide a laser processing method for a wafer which can form a laser processed groove along a separation line without direct deposition of debris onto the upper surface (work surface) of a wafer or onto the wall surface of the laser processed groove already formed on the wafer.

In accordance with an aspect of the present invention, there is provided a laser processing method for a wafer such that a laser beam is applied to a work surface of the wafer along a separation line formed on the work surface to thereby form a laser processed groove along the separation line on the work surface by ablation, the laser processing method including a protective material coating step for coating the work surface of the wafer with a liquid protective material mainly containing a water-soluble silicone oil; and a laser processed groove forming step for applying the laser beam to the work surface coated with the protective material along the separation line in the condition that the protective material has fluidity, thereby forming the laser processed groove along the separation line.

Preferably, the separation line includes a plurality of separation lines arranged in a matrix; and the laser processed groove forming step includes the steps of applying the laser beam to the work surface along a first group of the separation lines extending in a first predetermined direction and applying the laser beam to the work surface along a second group of the separation lines extending in a second predetermined direction perpendicular to the first predetermined direction.

Preferably, the water-soluble silicone oil includes polyether modified silicone oil. More preferably, the polyether modified silicone oil has a hydrophilic-lipophilic balance (HLB) of 8 or more.

Preferably, the laser processing method further includes a cleaning step for cleaning off the protective material from the work surface of the wafer with water after the laser processed groove forming step.

In the laser processing method for the wafer according to the present invention, the liquid protective material mainly containing the water-soluble silicone oil is first applied to the work surface of the wafer. Thereafter, the laser beam is applied to the work surface coated with the liquid protective material along the separation line in the condition where the protective material has fluidity, thereby forming the laser processed groove along the separation line. Accordingly, there is no possibility that the fluidic coating of the protective material formed on the work surface of the wafer may be separated from the work surface by the application of the laser beam. Accordingly, even when debris is generated by the application of the laser beam, the debris is blocked by the fluidic coating of the protective material, so that the debris is prevented from sticking to devices formed adjacent to the laser processed groove. Further, since the protective material mainly containing the water-soluble silicone oil has heat resistance, there is no possibility that the fluidic coating of the protective material may be melted by the heat of the debris sticking to the fluidic coating, thereby preventing the direct deposition of the debris to the devices.

Further, when the laser processed groove is formed along each separation line of the wafer by performing the laser processed groove forming step, the protective material coating having fluidity can flow into the laser processed groove. At this time, the debris having scattered onto the protective material coating can also flow into the laser processed groove. In the laser processed groove forming step, debris scatters at the intersection of each separation line extending in the first predetermined direction and each separation line extending in the second predetermined direction, and this scattered debris enters the laser processed groove already formed in the first predetermined direction. However, the laser processed groove already formed is filled with the protective material coating having fluidity, so that there is no possibility that the debris present in the laser processed groove may be deposited directly to the inner wall of the laser processed groove.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
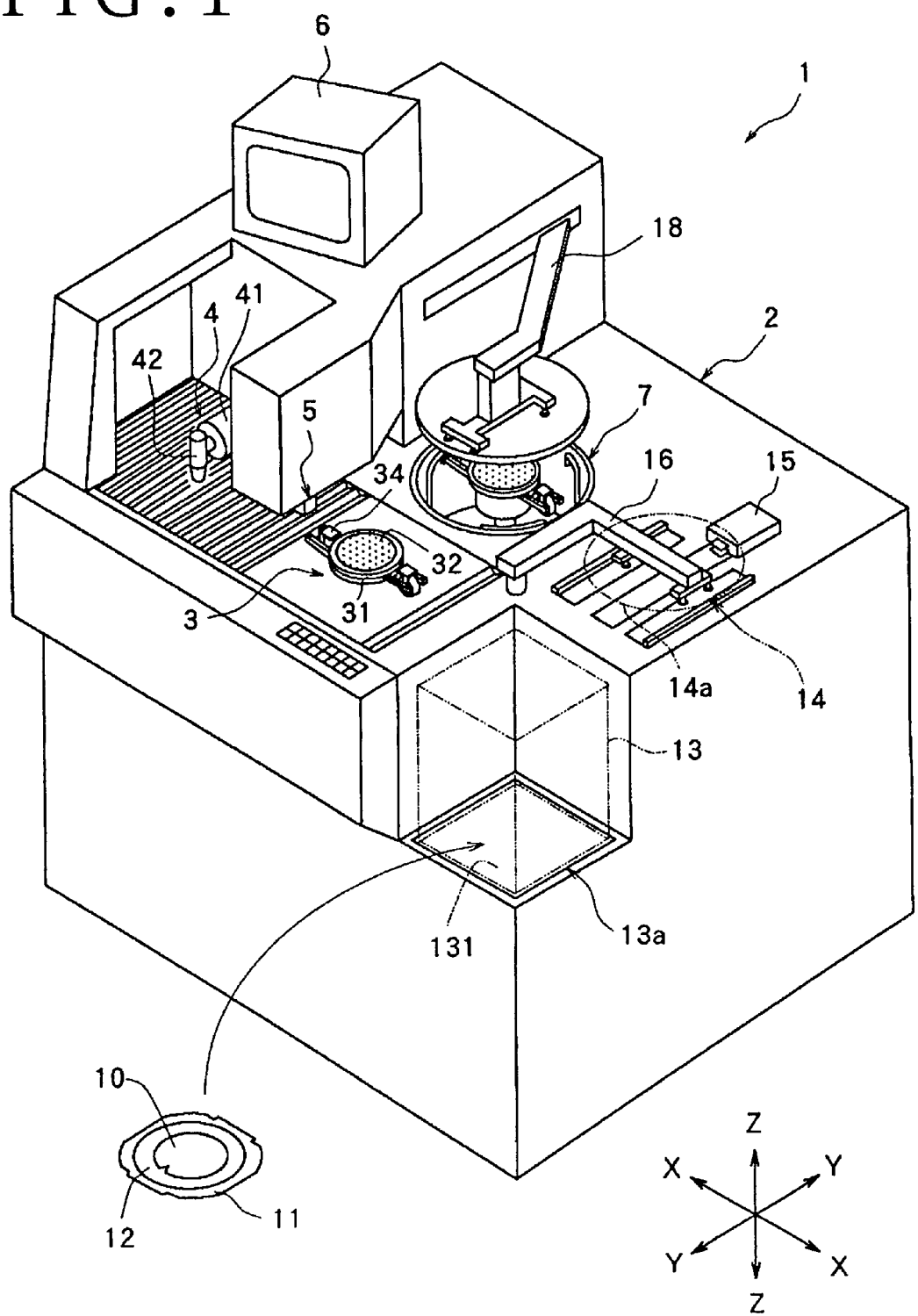
FIG. 1 is a perspective view of a laser processing device for carrying out the laser processing method for the wafer according to the present invention.

A preferred embodiment of the laser processing method for the wafer according to the present invention will now be described in detail with reference to the attached drawings. Referring to FIG. 1, there is shown a perspective view of a laser processing device 1 for carrying out the laser processing method for the wafer according to the present invention. The laser processing device 1 shown in FIG. 1 has a substantially boxlike housing 2. The housing 2 contains a chuck table 3 as work holding means for holding a work. The chuck table 3 is movable in the direction shown by an arrow X as a work feeding direction (grooving direction).

The chuck table 3 has a vacuum chuck support 31 and a vacuum chuck 32 mounted on the vacuum chuck support 31. The vacuum chuck 32 has an upper surface for placing a work such as a disk-shaped semiconductor wafer thereon. The work placed on the upper surface of the vacuum chuck 32 is held by suction means (not shown). Further, the chuck table 3 is rotatable by a rotating mechanism (not shown). The vacuum chuck support 31 of the chuck table 3 is provided with a pair of clamps 34 for fixing an annular frame for a disk-shaped semiconductor wafer to be hereinafter described.

The laser processing device 1 includes laser beam supplying means 4. The laser beam applying means 4 includes oscillating means 41 for oscillating a laser beam and focusing means 42 for focusing the laser beam oscillated by the oscillating means 41.

The laser processing device 1 further includes imaging means 5 for imaging the upper surface of the work held on the vacuum chuck 32 of the chuck table 3 to detect a region to be processed by the laser beam directed from the focusing means 42 of the laser beam applying means 4. The imaging means 5 is provided by optical means such as a microscope and a CCD camera. An image signal from the imaging means 5 is transmitted to control means (not shown). The laser processing device 1 further includes displaying means 6 for displaying the image obtained by the imaging means 5.

The laser processing device 1 further includes protective material coating and cleaning-off means 7 for coating the upper surface (work surface) of the wafer as the work to be processed with a liquid protective material mainly containing a water-soluble silicone oil and also for cleaning off the protective material from the upper surface of the wafer after processed. This protective material coating and cleaning-off means 7 will now be described with reference to FIGS. 2 to 4.

According to the embodiment of the present invention as shown in the figures, the protective material coating and cleaning-off means 7 includes a spinner table mechanism 71 and cleaning water receiving means 72 provided so as to surround the spinner table mechanism 71. The spinner table mechanism 71 includes a spinner table 711, an electric motor 712 for rotationally driving the spinner table 711, and a support mechanism 713 for vertically movably supporting the electric motor 712.

The spinner table 711 includes a vacuum chuck 711a formed of a porous material. The vacuum chuck 711a is connected to suction means (not shown). Accordingly, the spinner table 711 functions to hold the wafer as the work placed on the vacuum chuck 711a by using a vacuum produced by the suction means. The spinner table 711 is provided with a pair of clamps 714 for fixing the annular frame for the wafer to be hereinafter described.

The electric motor 712 has a drive shaft 712a, and the spinner table 711 is connected to the upper end of the drive shaft 712a. The support mechanism 713 is composed of a plurality of (three in this preferred embodiment) support legs 713a and a plurality of (three in this preferred embodiment) air cylinders 713b operatively connected to the support legs 713a, respectively. All of the air cylinders 713b are mounted on the electric motor 712. The support mechanism 713 functions in such a manner that the air cylinders 713b are operated to vertically move the electric motor 712 and the spinner table 711 between the upper position shown in FIG. 3 as a load/unload position and the lower position shown in FIG. 4 as a working position.

Figure 3:
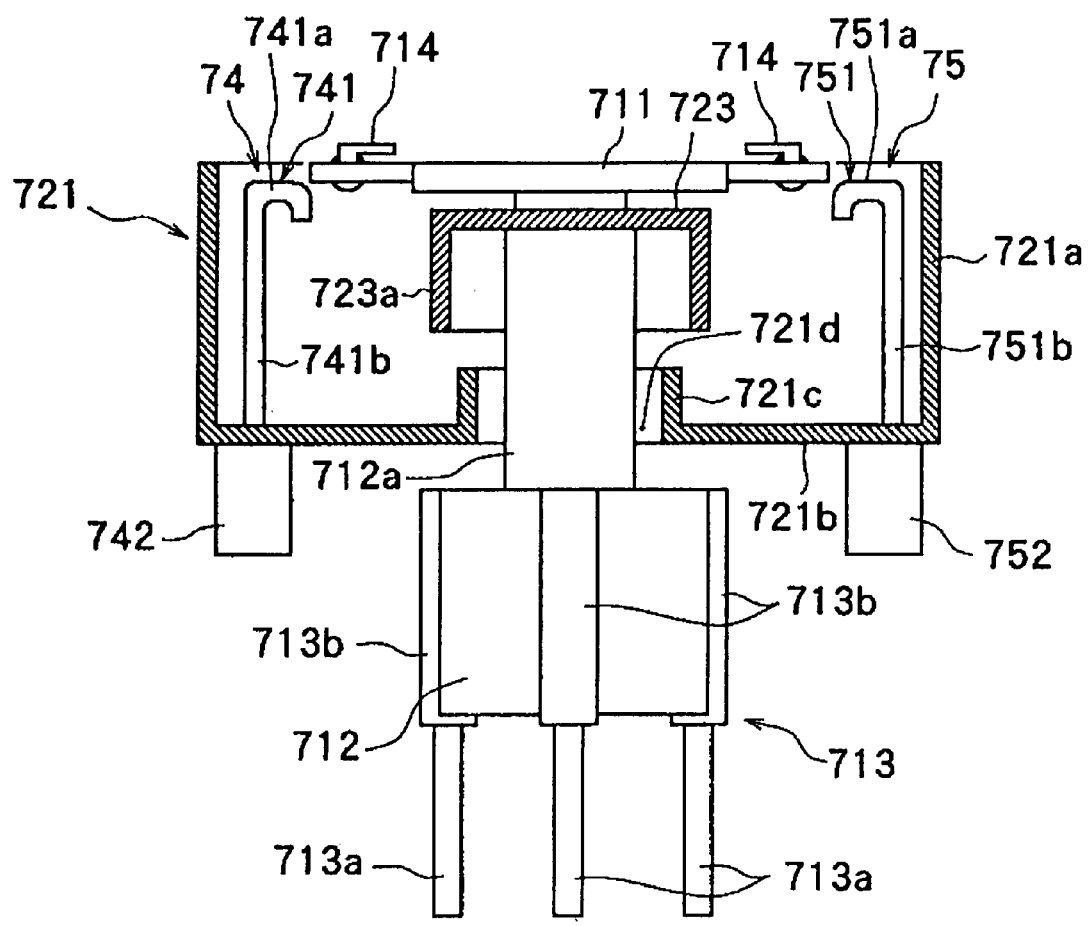
FIG. 3 is a vertical sectional view for illustrating a load/unload position of a spinner table included in the protective material coating and cleaning-off means shown in FIG. 2.
Figure 4:
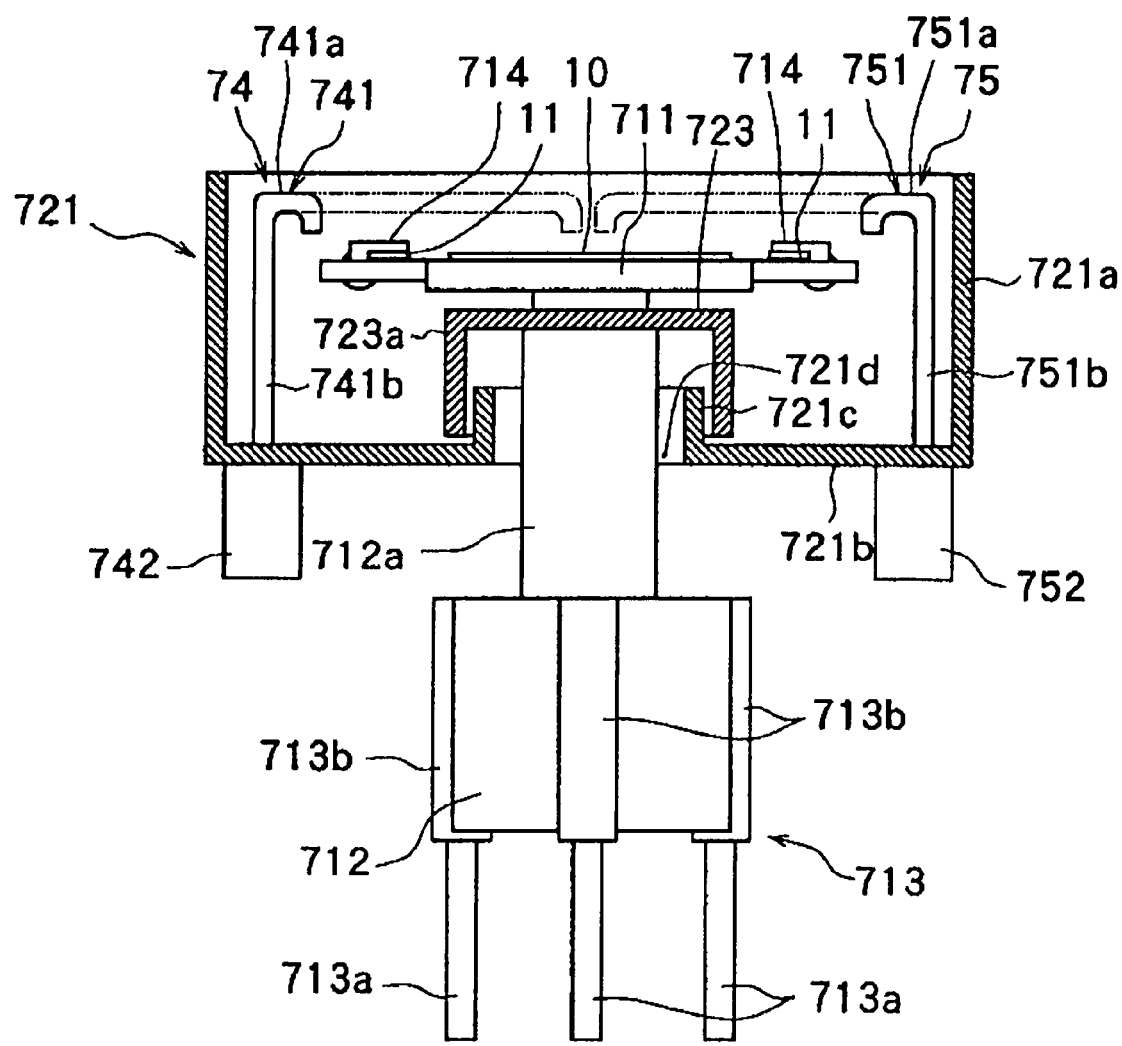
FIG. 4 is a vertical sectional view for illustrating a working position of the spinner table included in the protective material coating and cleaning-off means shown in FIG. 2.

The cleaning water receiving means 72 includes a cleaning water receptacle 721, three support legs 722 for supporting the cleaning water receptacle 721 (two of the three support legs 722 being shown in FIG. 2), and a cover member 723 mounted on the drive shaft 712a of the electric motor 712. As shown in FIGS. 3 and 4, the cleaning water receptacle 721 is composed of a cylindrical outer wall 721a, a bottom wall 721b, and a cylindrical inner wall 721c. The bottom wall 721b is formed with a central hole 721d for allowing the insertion of the drive shaft 712a of the electric motor 712. The cylindrical inner wall 721c projects upward from the peripheral edge of the central hole 721d.

Figure 2:
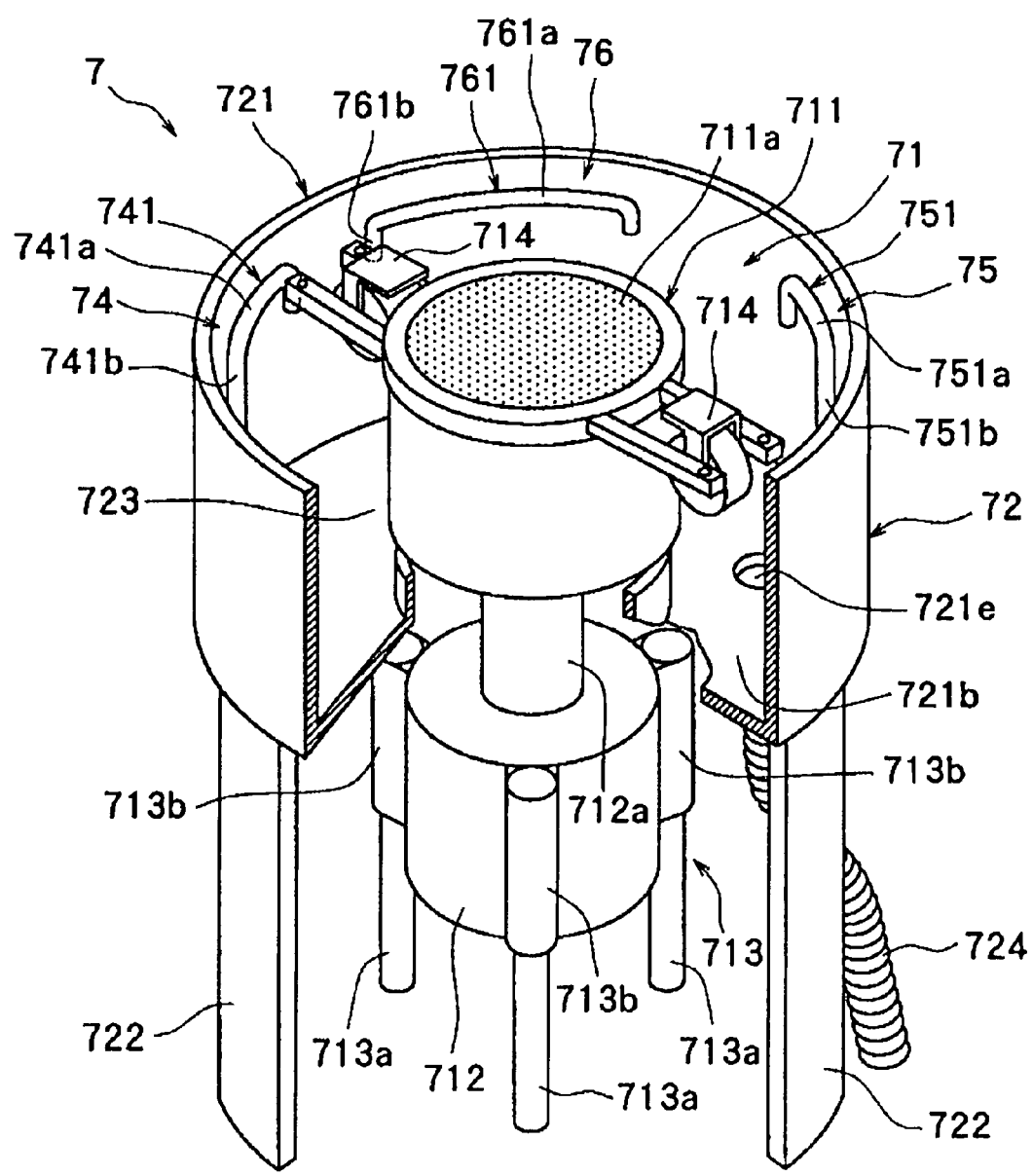
FIG. 2 is a partially cutaway, perspective view of protective material coating and cleaning-off means included in the laser processing device shown in FIG. 1.

As shown in FIG. 2, the bottom wall 721b is formed with a waste fluid outlet 721e, and a drain hose 724 is connected to the waste fluid outlet 721e. The cover member 723 is a cylindrical member having a closed top. The closed top of the cover member 723 is mounted to the upper end portion of the drive shaft 712a of the electric motor 712, and a covering portion 723a projects downward from the outer circumference of the closed top of the cover member 723. In the working position of the electric motor 712 and the spinner table 711 as shown in FIG. 4, the covering portion 723a of the cover member 723 is located so as to surround the cylindrical inner wall 721c of the cleaning water receptacle 721 with a given gap defined therebetween.

According to the embodiment of the present invention as shown in the figures, the protective material coating and cleaning-off means 7 further includes protective material supplying means 74 for supplying the liquid protective material mainly containing the water-soluble silicone oil to the upper surface of the wafer as the work held to the spinner table 711 before processing. The protective material supplying means 74 includes a protective material supply nozzle 741 for supplying the liquid protective material mainly containing the water-soluble silicone oil toward the upper surface of the wafer held to the spinner table 711 before processing and an electric reversible motor 742 for horizontally swinging the protective material supply nozzle 741. The protective material supply nozzle 741 is connected to a protective material supply source (not shown).

The protective material supply nozzle 741 is composed of a horizontally extending nozzle portion 741a having a downward bent front end and a support portion 741b extending downward from the base end of the nozzle portion 741a. The support portion 741b is inserted through a hole (not shown) formed through the bottom wall 721b of the cleaning water receptacle 721 and is connected to the protective material supply source (not shown). Although not shown, a seal member is mounted to the peripheral edge of this hole for allowing the insertion of the support portion 741b of the protective material supply nozzle 741, thereby sealing the gap between the support portion 741b and the bottom wall 721b.

According to the embodiment of the present invention as shown in the figures, the protective material coating and cleaning-off means 7 further includes cleaning water supplying means 75 and air supplying means 76 for cleaning the wafer held to the spinner table 711 after processing. The cleaning water supplying means 75 includes a cleaning water nozzle 751 for supplying a jet of cleaning water toward the upper surface of the wafer held to the spinner table 711 after processing and an electric reversible motor 752 for horizontally swinging the cleaning water nozzle 751. The cleaning water nozzle 751 is connected to a cleaning water supply source (not shown). The cleaning water nozzle 751 is composed of a horizontally extending nozzle portion 751a having a downward bent front end and a support portion 751b extending downward from the base end of the nozzle portion 751a. The support portion 751b is inserted through a hole (not shown) formed through the bottom wall 721b of the cleaning water receptacle 721 and is connected to the cleaning water supply source (not shown). Although not shown, a seal member is mounted to the peripheral edge of this hole for allowing the insertion of the support portion 751b of the cleaning water nozzle 751, thereby sealing the gap between the support portion 751b and the bottom wall 721b.

The air supplying means 76 includes an air nozzle 761 for supplying a jet of air toward the upper surface of the wafer held to the spinner table 711 after cleaning with the cleaning water mentioned above and an electric reversible motor (not shown) for horizontally swinging the air nozzle 761. The air nozzle 761 is connected to an air supply source (not shown). The air nozzle 761 is composed of a horizontally extending nozzle portion 761a having a downward bent front end and a support portion 761b extending downward from the base end of the nozzle portion 761a. The support portion 761b is inserted through a hole (not shown) formed through the bottom wall 721b of the cleaning water receptacle 721 and is connected to the air supply source (not shown). Although not shown, a seal member is mounted to the peripheral edge of this hole for allowing the insertion of the support portion 761b of the air nozzle 761, thereby sealing the gap between the support portion 761b and the bottom wall 721b.

Figure 5:
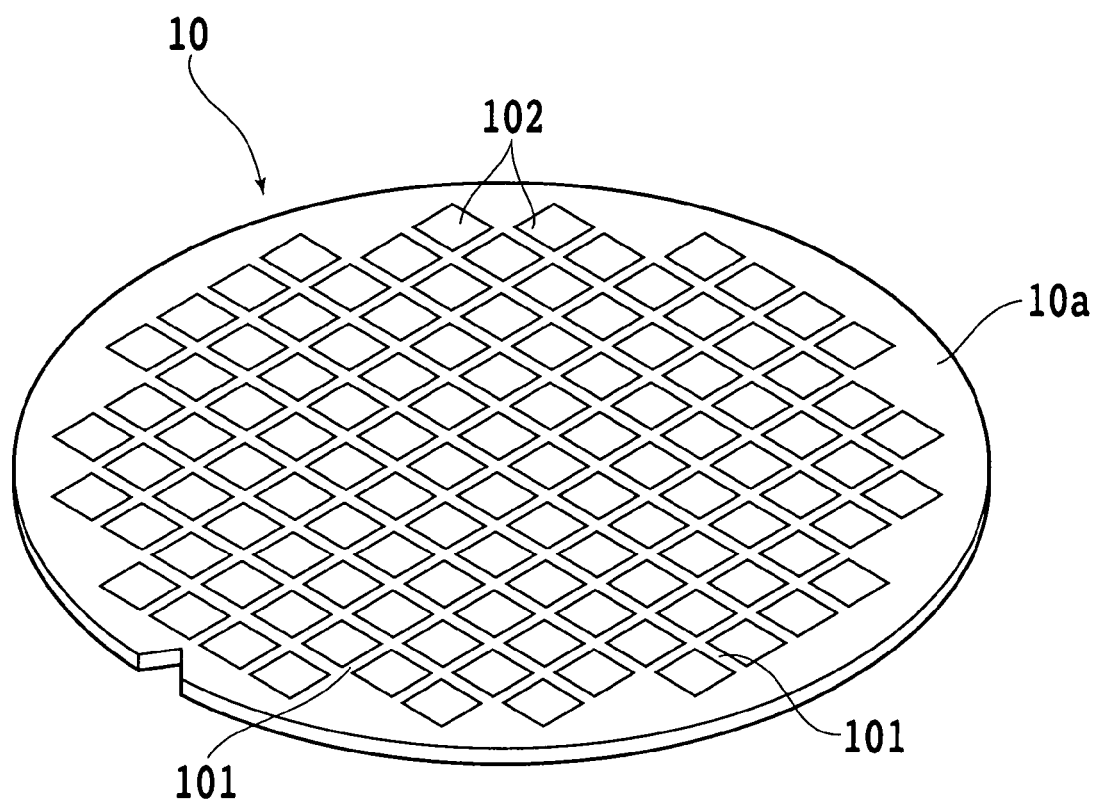
FIG. 5 is a perspective view of a semiconductor wafer as a work to be processed by the laser processing device shown in FIG. 1.

Referring back to FIG. 1, the laser processing device 1 further includes a cassette setting portion 13a for setting a cassette 13 storing a semiconductor wafer 10 as a work to be processed. The cassette setting portion 13a is provided with a cassette table 131 vertically movable by lifting means (not shown). The cassette 13 is set on the cassette table 131. The semiconductor wafer 10 is attached to the upper surface of a protective tape 12 mounted to an annular frame 11. Thus, the semiconductor wafer 10 supported through the protective tape 12 to the annular frame 11 is stored in the cassette 13. As shown in FIG. 5, the semiconductor wafer 10 has an upper surface (work surface) 10a partitioned into a plurality of rectangular regions by a plurality of separation lines (streets) 101 arranged in a matrix, wherein a device 101 such as IC and LSI is formed in each rectangular region. The lower surface (back surface) of the semiconductor wafer 10 is attached to the upper surface of the protective tape 12 mounted to the annular frame 11, and the upper surface 10a on which the separation lines 101 and the devices 102 are formed is subjected to laser processing.

The laser processing device 1 further includes positioning means 14 provided at a temporary setting portion 14a for positioning the semiconductor wafer 10 ejected from the cassette 13 and work ejecting/inserting means 15 for ejecting the semiconductor wafer 10 from the cassette 13 before processing and for inserting the semiconductor wafer 10 into the cassette 13 after processing. The laser processing device 1 further includes first carrying means 16 for carrying the semiconductor wafer 10 from the positioning means 14 to the protective material coating and cleaning-off means 7 to perform the coating of the protective material and for carrying the semiconductor wafer 10 from the protective material coating and cleaning-off means 7 to the chuck table 3 after the coating of the protective material. The laser processing device 1 further includes second carrying means 18 for carrying the semiconductor wafer 10 from the chuck table 3 to the protective material coating and cleaning-off means 7 after laser processing.

There will now be described a laser processing method for a wafer by the use of the laser processing device 1 such that laser processed grooves are formed along the separation lines 101 preliminarily formed on the upper surface 10a of the semiconductor wafer 10.

The semiconductor wafer 10 supported through the protective tape 12 to the annular frame 11 as shown in FIG. 1 (which wafer will be hereinafter referred to simply as the semiconductor wafer 10) is stored in the cassette 13 at a predetermined position thereof in the condition where the upper surface 10a is oriented upward. The cassette table 131 is next lifted by the lifting means to thereby move the semiconductor wafer 10 stored in the cassette 13 to an ejecting position where the semiconductor wafer 10 is ejected from the cassette 13. The work ejecting/inserting means 15 is next operated to eject the semiconductor wafer 10 from the cassette 13 and to move the semiconductor wafer 10 from the ejecting position to the positioning means 14 provided at the temporary setting portion 14a. The semiconductor wafer 10 thus moved to the positioning means 14 is set to a predetermined position by the positioning means 14.

The semiconductor wafer 10 thus positioned by the positioning means 14 is next carried onto the vacuum chuck 711a of the spinner table 711 of the protective material coating and cleaning-off means 7 by the rotational operation of the first carrying means 16, and is held to the vacuum chuck 711a by the suction means (wafer holding step). Further, the annular frame 11 is fixed by the clamps 714. At this time, the spinner table 711 is set at the load/unload position shown in FIG. 3, and all of the protective material supply nozzle 741, the cleaning water nozzle 751, and the air nozzle 761 are set at a standby position where they are retracted from the spinner table 711 as shown in FIGS. 2 and 3.

Figure 6A:
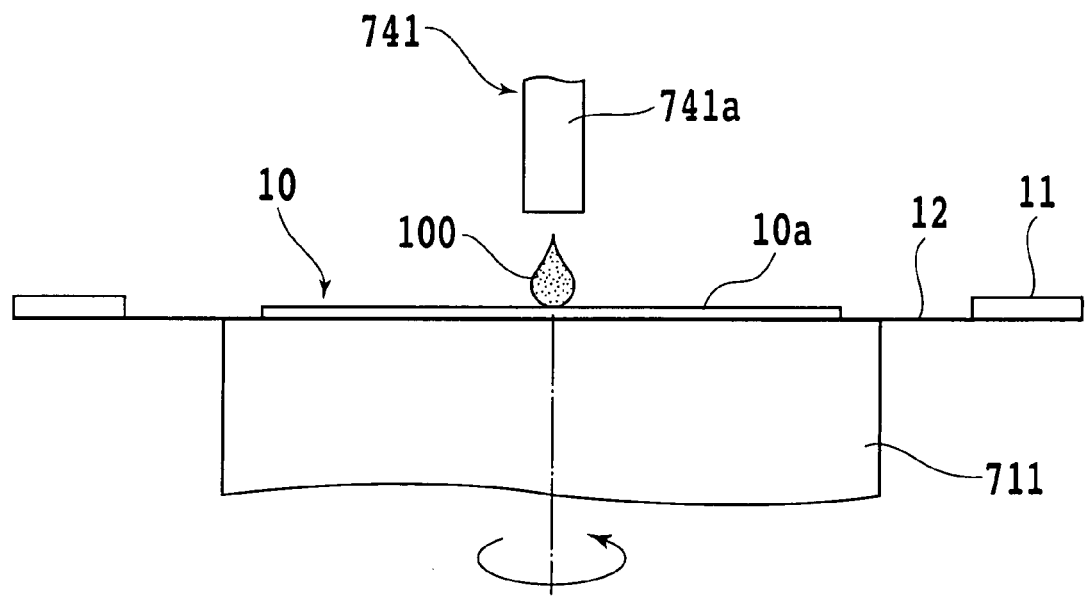
FIGS. 6A and 6B are schematic views for illustrating a protective material coating step in the laser processing method according to the present invention.

After the above-mentioned wafer holding step wherein the semiconductor wafer 10 is held on the spinner table 711 of the protective material coating and cleaning-off means 7, the liquid protective material mainly containing the water-soluble silicone oil is applied to the upper surface 10a of the semiconductor wafer 10 held on the spinner table 711 (protective material coating step). More specifically, the spinner table 711 is set to the working position, and the electric motor 742 of the protective material supplying means 74 is driven to swing the nozzle portion 741a of the protective material supply nozzle 741 so that the discharge opening of the nozzle portion 741a comes to a position directly above the center of the semiconductor wafer 10 held on the spinner table 711 as shown in FIG. 6A. Next, the spinner table 711 is rotated in the direction shown by an arrow R in FIG. 6A at a predetermined speed (e.g., 200 rpm) by driving the electric motor 712. At the same time, a liquid protective material 100 is dropped from the protective material supply nozzle 741 of the protective material supplying means 74 onto the central portion of the upper surface 10a (work surface) of the semiconductor wafer 10 by a predetermined amount (e.g., 1 cc in the case that the diameter of the semiconductor wafer 10 is 200 mm).

Preferably, the water-soluble silicone oil contained in the liquid protective material 100 has good wettability to the wafer, a hydrophilic-lipophilic balance (HLB) of 8 or more, heat resistance, and low viscosity such that fluidity can be maintained without solidification even at high temperatures. As an example of the water-soluble silicone oil having such characteristics, polyether modified silicone oil is preferably used. For example, "KF-6011" manufactured by Shi-Etsu Chemical Co., Ltd. may be used as the polyether modified silicone oil. As a modification, about 10% of surface active agent may be mixed into the water-soluble silicone oil, so as to further improve the wettability to the wafer.

Figure 6B:
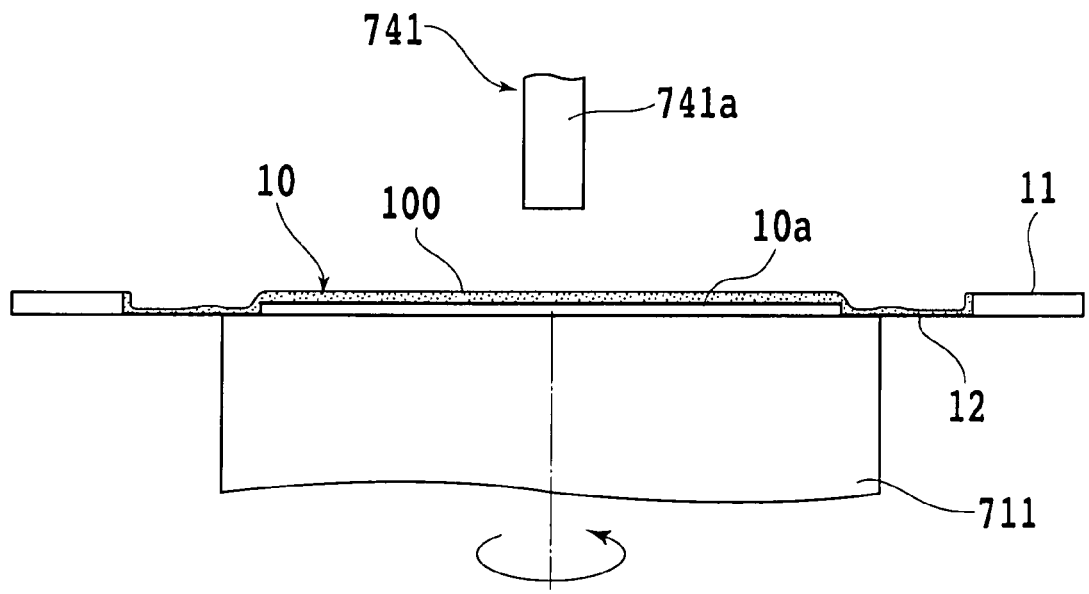

In this manner, 1 cc of the liquid protective material 100 mainly containing the water-soluble silicone oil is dropped onto the central portion of the upper surface 10a (work surface) of the semiconductor wafer 10 held on the spinner table 711, and the spinner table 711 is rotated at 200 rpm for about 60 seconds. As a result, the upper surface 10a of the semiconductor wafer 10 is coated with the liquid protective material 100 in the form of a thin film having a thickness of about 1μ as shown in FIG. 6B. Even in a time interval between the present protective material coating step and the next protective material coating step, there is no possibility that the discharge opening of the nozzle portion 741a of the protective material supply nozzle 741 may be clogged with the liquid protective material because of the good fluidity of the water-soluble silicone oil mainly contained in the liquid protective material.

After this protective material coating step, the spinner table 711 is lifted to the load/unload position shown in FIG. 3 and the vacuum chuck to the semiconductor wafer 10 held on the spinner table 711 is canceled. Next, the semiconductor wafer 10 is carried from the spinner table 711 to the vacuum chuck 32 of the chuck table 3 by the first carrying means 16, and is held to the vacuum chuck 32 by the suction means. Next, the chuck table 3 holding the semiconductor wafer 10 is moved to a position directly below the imaging means 5 by moving means (not shown).

When the chuck table 3 is set to the position directly below the imaging means 5 as mentioned above, the imaging means 5 and the control means connected thereto perform image processing such as pattern matching for aligning each separation line 101 extending in a first predetermined direction on the upper surface 10a of the semiconductor wafer 10 to the focusing means 42 of the laser beam applying means 4 for applying a laser beam along each separation line 101. Thus, the alignment of a laser beam spot to each separation line 101 extending in the first predetermined direction is performed. Similarly, the alignment of a laser beam spot to each separation line 101 extending in a second predetermined direction perpendicular to the first predetermined direction is also performed. In the case that the protective film 100 formed on the upper surface 10a of the semiconductor wafer 10 is not transparent, infrared radiation for imaging may be used for the alignment of a laser beam spot to each separation line 101.

After detecting each separation line 101 formed on the upper surface 10a of the semiconductor wafer 10 held on the chuck table 3 to perform the alignment of a laser beam spot to each separation line 101, a laser beam is applied through the protective film 100 to the upper surface 10a of the semiconductor wafer 10 along each separation line 101 in the condition where the protective film 100 has fluidity, thereby forming a laser processed groove along each separation line 101 (laser processed groove forming step). More specifically, the chuck table 3 is moved to a laser beam applying region where the focusing means 42 of the laser beam applying means 4 is located, and a predetermined one of the separation lines 101 extending in the first predetermined direction is positioned directly below the focusing means 42. At this time, the semiconductor wafer 10 is set so that one end (left end as viewed in FIG. 7A) of this predetermined separation line 101 is positioned directly below the focusing means 42 as shown in FIG. 7A.

Figure 7A:
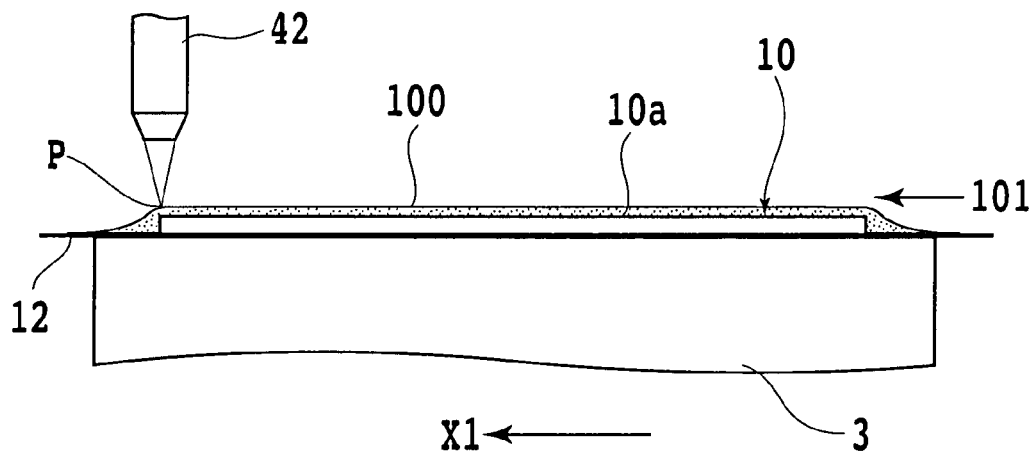
FIGS. 7A and 7B are schematic views for illustrating a laser processed groove forming step in the laser processing method according to the present invention.
Figure 7B:
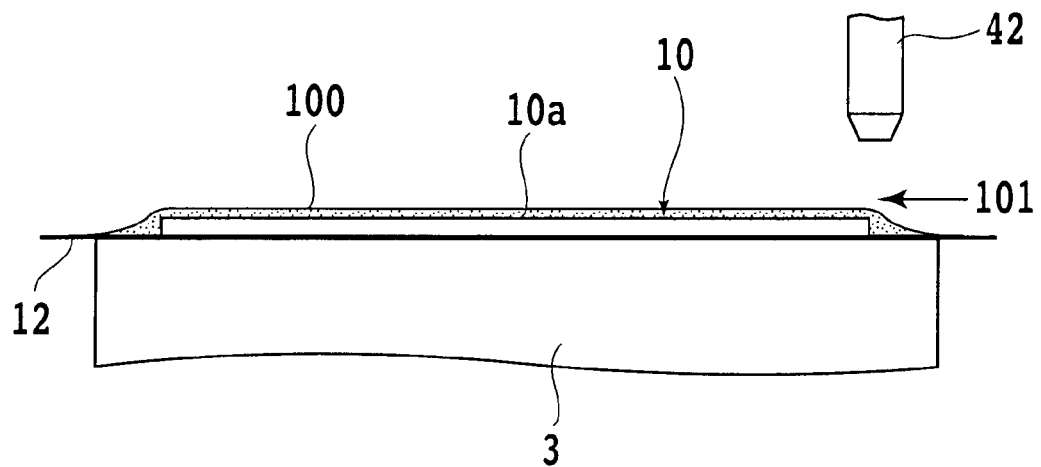

Next, a pulsed laser beam is applied from the focusing means 42 of the laser beam applying means 4 to the upper surface 10a of the semiconductor wafer 10 along this predetermined separation line 101 as moving the chuck table 3 holding the semiconductor wafer 10 in the direction shown by an arrow X1 in FIG. 7A at a predetermined feed speed. When the other end (right end as viewed in FIG. 7B) of the predetermined separation line 101 comes to a position directly below the focusing means 42 as shown in FIG. 7B, the application of the pulsed laser beam is stopped and the movement of the chuck table 3 is also stopped. As shown in FIG. 7A, a focal point P of the focusing means 42 is set near the upper surface of the predetermined separation line 101.

Figure 8A:
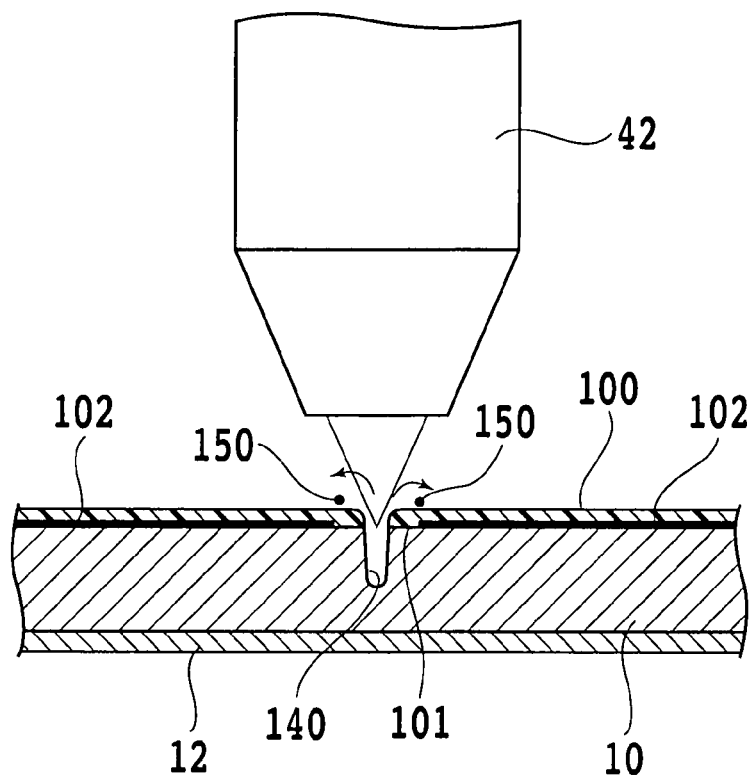
FIGS. 8A and 8B are enlarged sectional views of an essential part of the semiconductor wafer as a work processed by the laser processed groove forming step shown in FIGS. 7A and 7B.
Figure 8B:
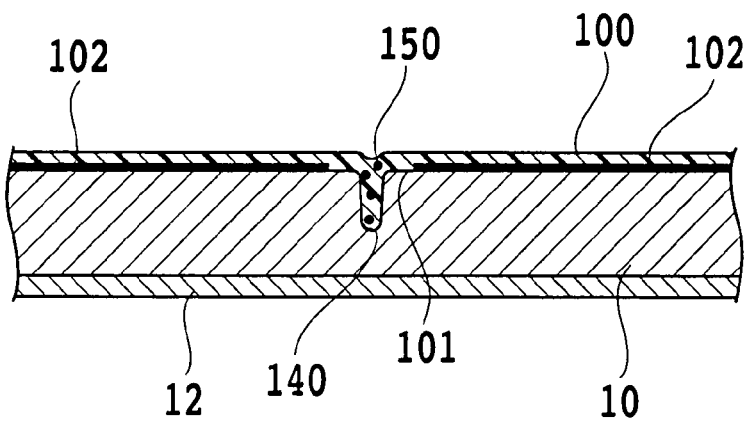

In the laser processed groove forming process mentioned above, ablation is performed along each separation line 101 of the semiconductor wafer 10 to thereby form a laser processed groove 140 along each separation line 101 of the semiconductor wafer 10 as shown in FIG. 8A. At this time, there is no possibility that the protective film 100 formed on the upper surface 10a (work surface) of the semiconductor wafer 10 may be separated from the upper surface 10a by the application of the pulsed laser beam because of the fluidity of the protective film 100. Accordingly, even when debris 150 is generated by the application of the pulsed laser beam as shown in FIG. 8A, the debris 150 is blocked by the protective film 100, so that the debris 150 is prevented from sticking to devices 102 formed adjacent to the laser processed groove 140. Further, since the protective film 100 has heat resistance (e.g., 400° C.) as mentioned above, there is no possibility that the protective film 100 may be melted by the heat of the debris 150 sticking to the protective film 100, thereby preventing the direct deposition of the debris 150 to the devices 102. Further, when the laser processed groove 140 is formed along each separation line 101 of the semiconductor wafer 10 by performing the laser processed groove forming step mentioned above, the protective film 100 having fluidity can flow into the laser processed groove 140.

After forming the laser processed groove 140 along each separation line 101 extending in the first predetermined direction on the semiconductor wafer 10 as mentioned above, the chuck table 3 is rotated 90° to form a laser processed groove extending along each separation line 101 in the second predetermined direction perpendicular to the first predetermined direction. In this laser processed groove forming step, debris scatters at the intersection of each separation line 101 extending in the first predetermined direction and each separation line 101 extending in the second predetermined direction, and this scattered debris enters the laser processed groove 140 already formed in the first predetermined direction. However, the laser processed groove 140 already formed is filled with the protective film 100 having fluidity, so that there is no possibility that the debris present in the laser processed groove 140 may be deposited directly to the inner wall of the laser processed groove 140.

For example, the laser processed groove forming step is performed under the following processing conditions.

Light source of laser beam: YVO4 laser or YAG laser
Wavelength: 355 nm
Repetition frequency: 10 kHz
Output: 8 W
Focused spot diameter: 20 μm
Work feed speed: 100 mm/sec After performing the laser processed groove forming step along all of the separation lines (streets) 101 of the semiconductor wafer 10, the chuck table 3 is returned to the initial position shown in FIG. 1 and the vacuum chuck to the semiconductor wafer 10 is canceled. Next, the semiconductor wafer 10 is carried to the vacuum chuck 711a of the spinner table 711 of the protective material coating and cleaning-off means 7 by the second carrying means 18, and is held to the vacuum chuck 711a by the suction means. At this time, all of the protective material supply nozzle 741, the cleaning water nozzle 751, and the air nozzle 761 are set at the standby position retracted from the spinner table 711 as shown in FIG. 3.

In the condition where the semiconductor wafer 10 processed above is held on the spinner table 711 of the protective material coating and cleaning-off means 7, the protective film 100 formed on the upper surface 10a of the semiconductor wafer 10 is cleaned off by the cleaning water (cleaning step). More specifically, the spinner table 711 is lowered to the working position shown in FIG. 4 and the electric motor 752 of the cleaning water supplying means 75 is driven to move the discharge opening of the nozzle portion 751a of the cleaning water supply nozzle 751 to the position directly above the center of the semiconductor wafer 10 held on the spinner table 711. Next, the spinner table 711 is rotated at 800 rpm, for example, and the cleaning water composed of pure water and air is discharged from the discharge opening of the nozzle portion 751a.

The nozzle portion 751a is provided by a so-called two-fluid nozzle such that about 0.2 MPa of pure water and about 0.3 to 0.5 MPa of air are supplied and the pure water is sprayed by the pressure of the air to clean the upper surface 10a of the semiconductor wafer 10 processed. At this time, the electric motor 752 is driven to swing the nozzle portion 751a of the cleaning water supply nozzle 751 in a required range from the center of the semiconductor wafer 10 to the outer circumference thereof. As a result, the protective film 100 formed on the upper surface 10a of the semiconductor wafer 10 can be easily cleaned off by the cleaning water because the protective film 100 mainly contains a water-soluble silicone oil. At the same time, the debris 150 generated in the laser processed groove forming step is also removed with the protective film 100.

After the cleaning step mentioned above, air is discharged from the air nozzle 761 onto the upper surface 10a of the semiconductor wafer 10 to dry the semiconductor wafer 10 (drying step). More specifically, the cleaning water supply nozzle 751 is returned to the standby position, and the spinner table 711 is rotated at 3000 rpm for about 15 seconds as discharging air from the air nozzle 761.

After the cleaning step and the drying step mentioned above, the rotation of the spinner table 711 is stopped and the air nozzle 761 of the air supplying means 76 is returned to the standby position. Next, the spinner table 711 is lifted to the load/unload position shown in FIG. 3 and the vacuum chuck to the semiconductor wafer 10 held on the spinner table 711 is canceled. Next, the semiconductor wafer 10 is carried from the spinner table 711 to the positioning means 14 by the first carrying means 16. Finally, the semiconductor wafer 10 is carried from the positioning means 14 to the cassette 13 and inserted into the predetermined position of the cassette 13 by the work ejecting/inserting means 15.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing method for a wafer such that a laser beam is applied to a work surface of said wafer along a separation line formed on said work surface to thereby form a laser processed groove along said separation line on said work surface by ablation, said laser processing method comprising:
    a protective material coating step for coating said work surface of said wafer with a liquid protective material mainly containing a water-soluble silicone oil; and
    a laser processed groove forming step for applying said laser beam to said work surface coated with said protective material along said separation line in the condition that said protective material has fluidity, thereby forming said laser processed groove along said separation line.

2. The laser processing method according to claim 1, wherein:
    said separation line comprises a plurality of separation lines arranged in a matrix; and
    said laser processed groove forming step comprises the steps of applying said laser beam to said work surface along a first group of said separation lines extending in a first predetermined direction and applying said laser beam to said work surface along a second group of said separation lines extending in a second predetermined direction perpendicular to said first predetermined direction.

3. The laser processing method according to claim 1, wherein said water-soluble silicone oil comprises polyether modified silicone oil.

4. The laser processing method according to claim 3, wherein said polyether modified silicone oil has a hydrophilic lipophilic balance (HLB) of 8 or more.

5. The laser processing method according to claim 1, further comprising a cleaning step for cleaning off said protective material from said work surface of said wafer with water after said laser processed groove forming step.

* * * * *